(12) United States Patent
Jones et al.

(10) Patent No.: US 6,815,232 B2
(45) Date of Patent: Nov. 9, 2004

(54) METHOD AND APPARATUS FOR OVERLAY CONTROL USING MULTIPLE TARGETS

(75) Inventors: Gary K Jones, Austin, TX (US);
Christopher A Bode, Austin, TX (US);
Richard D Edwards, Austin, TX (US)

(73) Assignee: Advanced Micro Devices, Inc., Austin, TX (US)

( * ) Notice: Subject to any disclaimer, the term of this patent is extended or adjusted under 35 U.S.C. 154(b) by 168 days.

(21) Appl. No.: 10/305,305

(22) Filed: Nov. 26, 2002

(65) Prior Publication Data

US 2004/0101983 A1 May 27, 2004

(51) Int. Cl.[7] ............................................. H01L 21/66
(52) U.S. Cl. ............................................................ 438/14
(58) Field of Search ............................ 438/5, 7, 14, 15, 438/16; 700/121

(56) References Cited

U.S. PATENT DOCUMENTS

| | | | | |
|---|---|---|---|---|
| 6,077,756 A | * | 6/2000 | Lin et al. | 438/401 |
| 6,309,944 B1 | * | 10/2001 | Sheng et al. | 438/401 |
| 6,350,548 B1 | * | 2/2002 | Leidy et al. | 430/22 |
| 6,405,096 B1 | | 6/2002 | Toprac et al. | 700/121 |
| 6,460,002 B1 | | 10/2002 | Bone et al. | 702/81 |
| 6,484,060 B1 | * | 11/2002 | Baluswamy et al. | 700/58 |
| 2001/0036582 A1 | * | 11/2001 | Kitagawa | 430/5 |
| 2003/0044057 A1 | * | 3/2003 | Lan | 382/145 |

* cited by examiner

*Primary Examiner*—David A. Zarneke
*Assistant Examiner*—Scott B. Geyer
(74) *Attorney, Agent, or Firm*—Williams, Morgan & Amersen

(57) ABSTRACT

A method includes measuring a first overlay error between a first process layer and a second process layer using a first overlay target formed on the second process layer. A second overlay error between the first process layer and a third process layer is measured using a second overlay target formed on the third process layer. At least one parameter of an operating recipe for performing a photolithography process on the first process layer is determined based on the first and second overlay error measurements. A system includes a metrology tool and a controller. The metrology tool is configured to measure a first overlay error between a first process layer and a second process layer using a first overlay target formed on the second process layer and measure a second overlay error between the first process layer and a third process layer using a second overlay target formed on the third process layer. The controller is configured to determine at least one parameter of an operating recipe for performing a photolithography process on the first process layer based on the first and second overlay error measurements.

24 Claims, 4 Drawing Sheets

METHOD AND APPARATUS FOR OVERLAY CONTROL USING MULTIPLE TARGETS

BACKGROUND OF THE INVENTION

1. Field of the Invention

This invention relates generally to the field of semiconductor device manufacturing and, more particularly, to a method and apparatus for overlay control using multiple targets.

2. Description of the Related Art

There is a constant drive within the semiconductor industry to increase the quality, reliability and throughput of integrated circuit devices, e.g., microprocessors, memory devices, and the like. This drive is fueled by consumer demands for higher quality computers and electronic devices that operate more reliably. These demands have resulted in a continual improvement in the manufacture of semiconductor devices, e.g., transistors, as well as in the manufacture of integrated circuit devices incorporating such transistors. Additionally, reducing the defects in the manufacture of the components of a typical transistor also lowers the overall cost per transistor as well as the cost of integrated circuit devices incorporating such transistors.

The technologies underlying semiconductor processing tools have attracted increased attention over the last several years, resulting in substantial refinements. However, despite the advances made in this area, many of the processing tools that are currently commercially available suffer certain deficiencies. In particular, such tools often lack advanced process data monitoring capabilities, such as the ability to provide historical parametric data in a user-friendly format, as well as event logging, real-time graphical display of both current processing parameters and the processing parameters of the entire run, and remote, i.e., local site and worldwide, monitoring. These deficiencies can engender non-optimal control of critical processing parameters, such as throughput, accuracy, stability and repeatability, processing temperatures, mechanical tool parameters, and the like. This variability manifests itself as within-run disparities, run-to-run disparities and tool-to-tool disparities that can propagate into deviations in product quality and performance, whereas an ideal monitoring and diagnostics system for such tools would provide a means of monitoring this variability, as well as providing means for optimizing control of critical parameters.

Semiconductor devices are manufactured from wafers of a semiconducting material. Layers of materials are added, removed, and/or treated during fabrication to create the electrical circuits that make up the device. The fabrication essentially comprises four basic operations. Although there are only four basic operations, they can be combined in hundreds of different ways, depending upon the particular fabrication process.

The four operations typically used in the manufacture of semiconductor devices are:

layering, or adding thin layers of various materials to a wafer from which a semiconductor device is produced;

patterning, or removing selected portions of added layers;

doping, or placing specific amounts of dopants in the wafer surface through openings in the added layers; and heat treatment, or heating and cooling the materials to produce desired effects in the processed wafer.

As technology advances facilitate smaller critical dimensions for semiconductor devices, the need for reduction of errors increases dramatically. Proper formation of subsections within a semiconductor device is an important factor in ensuring proper performance of the manufactured semiconductor device. Critical dimensions of the subsections generally have to be within a predetermined acceptable margin of error for semiconductor devices to be within acceptable manufacturing quality.

One important aspect of semiconductor manufacturing is overlay control. Overlay control involves measuring the misalignment between two successive patterned layers on the surface of a semiconductor device. Generally, minimization of misalignment errors is important to ensure that the multiple layers of the semiconductor devices are connected and functional. As advances in technology facilitate smaller critical dimensions for semiconductor devices the need for the reduction of misalignment errors increases significantly.

Generally, a set of photolithography steps is performed on a lot of wafers using a semiconductor manufacturing tool commonly referred to as an exposure tool or a stepper. The manufacturing tool communicates with a manufacturing framework or a network of processing modules. The manufacturing tool is generally connected to an equipment interface. The equipment interface is connected to a machine interface to which the stepper is connected, thereby facilitating communications between the stepper and the manufacturing framework. The machine interface may generally be part of an advanced process control (APC) system. The APC system initiates a control script, which can be a software program that automatically retrieves the data needed to execute a manufacturing process. The input parameters that control the manufacturing process are revised periodically in a manual fashion. As the need for higher precision manufacturing processes are required, improved methods are needed to revise input parameters that control manufacturing processes in a more automated and timely manner.

Typical overlay control techniques employ a feedback control methodology, where after patterning a layer of photoresist material, metrology data is collected to measure misregistration, or overlay error, between the photoresist layer and underlying layer(s). The feedback generated from the overlay error measurement may be provided to a process controller for updating the control signals of the photolithography tools for subsequently processed wafers. The overlay error may also be used in a fault detection scheme, whereby wafers with overlay errors that exceed a predetermined threshold are reworked by removing the errant photoresist layer and patterning a new one.

Referring to FIGS. 1A and B, top and cross-section views of a semiconductor device 100 are provided, respectively. A first overlay target 110 is formed on a first process layer 120. A second process layer 130, typically a photoresist layer, is formed over the first process layer 120. When the photoresist material in the second process layer 130 is patterned, a second overlay target 140 is defined in the pattern. Using the first and second overlay targets 110, 140, the misregistration between the pattern in the second process layer 130 and the first process layer 120 is measured in the X and Y directions. If the misregistration is sufficiently large, the second process layer 130 may be removed and reworked. The measured misregistration may also be used to control the photolithography stepper to reduce the amount of overlay error for subsequent exposure processes. The overlay targets 110, 140 shown in FIGS. 1A and 1B are commonly referred to as box-in-box overlay targets, although other types of target geometries may be used.

Overlay error may be measured in the X and Y directions by measuring the distances between the sides of the targets 110, 140. For example, to measure overlay error in the X direction, the distance between sides 111, 141 may be compared to the distance been sides 112, 142. The overlay error is the half the difference between the measured distances. If the distance between the sides 111, 141 is 0.05 microns and the distance between the sides 112, 142 is 0.03 microns, the overlay error in the X direction is (0.05−0.03)/2=+0.01 micron. A distance of 0.04 microns for each group of sides would represent an overlay error of zero. A similar process may be used for determining overlay error in the Y direction.

Typically, each patterned layer is aligned by measuring X and Y overlay error with respect to a single set of overlay targets. The alignment process is typically performed iteratively as additional process layers are added to the device 100. However, because a particular wafer may be processed by different photolithography tools throughout the fabrication cycle, and also because the photolithography tool settings are being constantly updated to control overlay error, the degree of misregistration typically varies between layers. Hence, aligning the photoresist pattern with an overlay target formed on one process layer may not necessarily result in the photoresist pattern being aligned with other underlying layers. If the overlay error is sufficiently large, the fabricated device may be defective, have reduced performance, or may require rework.

The present invention is directed to overcoming, or at least reducing the effects of, one or more of the problems set forth above.

SUMMARY OF THE INVENTION

One aspect of the present invention is seen in a method including measuring a first overlay error between a first process layer and a second process layer using a first overlay target formed on the second process layer. A second overlay error between the first process layer and a third process layer is measured using a second overlay target formed on the third process layer. At least one parameter of an operating recipe for performing a photolithography process on the first process layer is determined based on the first and second overlay error measurements.

Another aspect of the present invention is seen in a system including a metrology tool and a controller. The metrology tool is configured to measure a first overlay error between a first process layer and a second process layer using a first overlay target formed on the second process layer and measure a second overlay error between the first process layer and a third process layer using a second overlay target formed on the third process layer. The controller is configured to determine at least one parameter of an operating recipe for performing a photolithography process on the first process layer based on the first and second overlay error measurements.

BRIEF DESCRIPTION OF THE DRAWINGS

The invention may be understood by reference to the following description taken in conjunction with the accompanying drawings, in which like reference numerals identify like elements, and in which.

DETAILED DESCRIPTION OF SPECIFIC EMBODIMENTS

Illustrative embodiments of the invention are described below. In the interest of clarity, not all features of an actual implementation are described in this specification. It will of course be appreciated that in the development of any such actual embodiment, numerous implementation-specific decisions must be made to achieve the developers' specific goals, such as compliance with system-related and business-related constraints, which will vary from one implementation to another. Moreover, it will be appreciated that such a development effort might be complex and time-consuming, but would nevertheless be a routine undertaking for those of ordinary skill in the art having the benefit of this disclosure.

Overlay control is an important aspect of semiconductor manufacturing. In particular, overlay control involves measuring misalignment errors between semiconductor layers during manufacturing processes. Improvements in overlay control may result in substantial enhancements, in terms of quality and efficiency, in semiconductor manufacturing processes. The present invention provides various methods of implementing automated error correction for control of overlay error using multiple overlay targets.

Figure 1A:
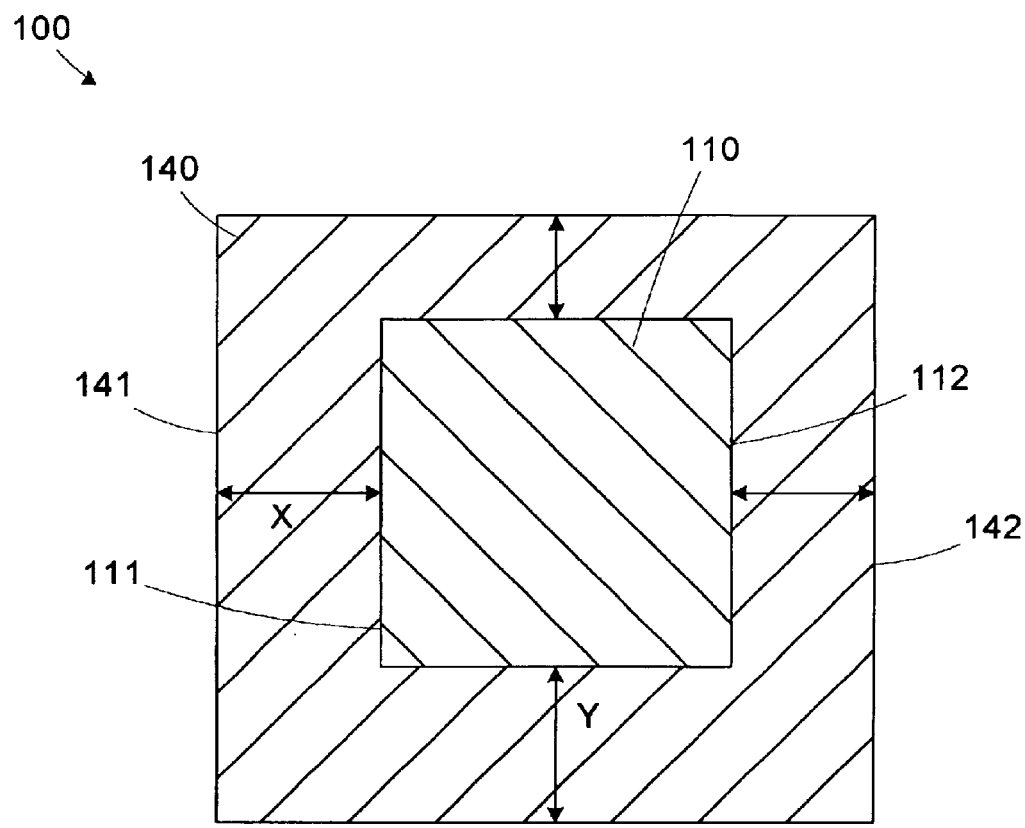
FIGS. 1A and 1B are top and cross-section views of a semiconductor device illustrating conventional overlay targets used to measure misregistration between process layers.
Figure 1B:
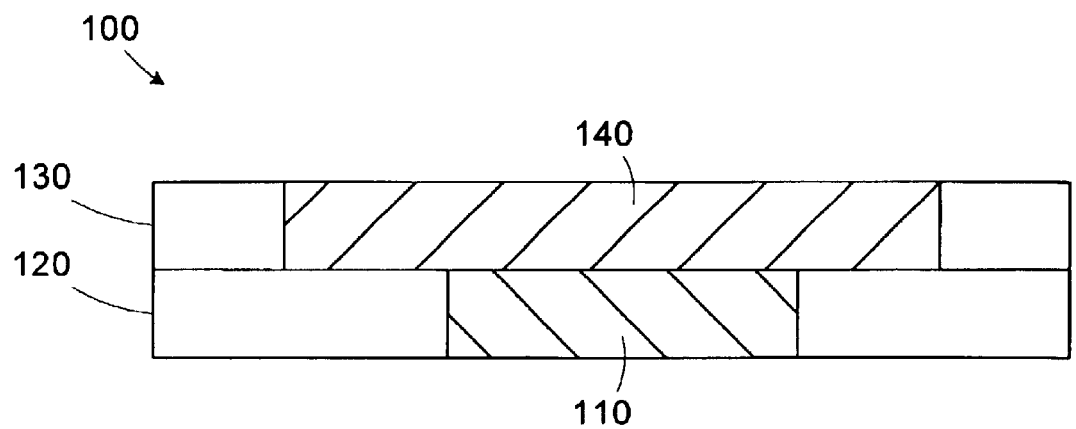
Figure 2:
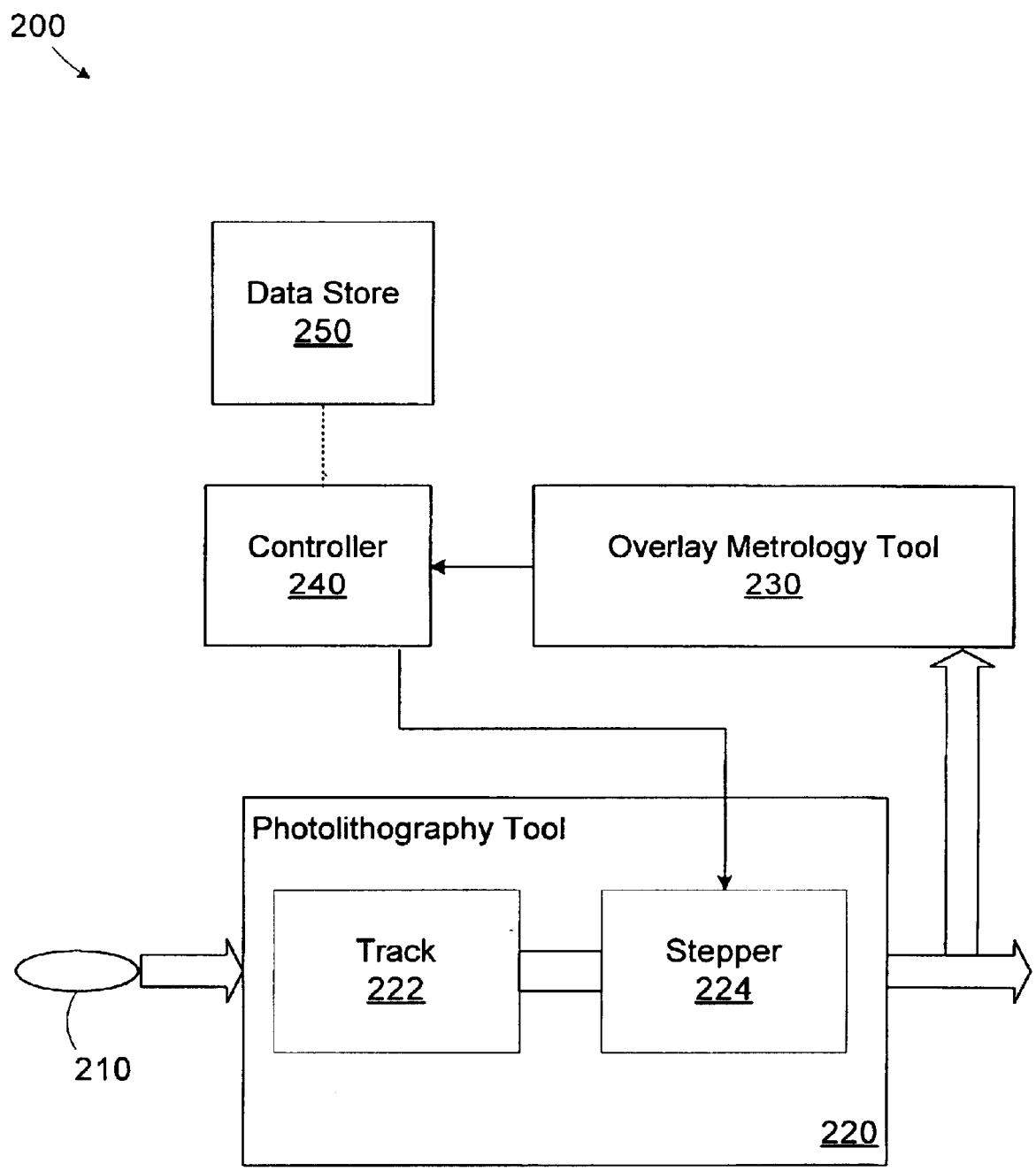
FIG. 2 is a simplified diagram of an illustrative processing line for processing wafers in accordance with one illustrative embodiment of the present invention.

Referring to FIG. 2, a simplified diagram of an illustrative processing line 200 for processing wafers 210 in accordance with one illustrative embodiment of the present invention is provided. The processing line 200 includes a photolithography tool 220 for forming a pattern in a photoresist layer formed on the wafer 210. The photolithography tool 220 includes a track 222 coupled to a stepper 224. The track 222 spins photoresist material onto the wafer 210 and pre-bakes the photoresist layer. The stepper 224 exposes the photoresist layer to form a pattern in the photoresist layer. The track 222 then performs a post-exposure bake (i.e., if necessary for the type of photoresist layer used) and applies a developer solution to remove the exposed portions of the photoresist layer (i.e., for a positive-type photoresist material) to generate a pattern in the photoresist layer. The patterned photoresist layer is typically used as a mask for a subsequent etch process used to form features on the wafer 210 or as a mask for performing an implantation process (e.g., for doping a substrate to form active regions).

The processing line 200 also includes an overlay metrology tool 230 adapted to determine overlay errors in photoresist patterns formed by the photolithography tool 220. In general, the overlay metrology tool 230 may be any type of tool capable of measuring overlay error. For example, the overlay metrology tool 230 may include an optical review station, such as a 5200XP Overlay Metrology System offered by KLA-Tencor Corporation of San Jose, Calif. The overlay metrology tool 230 may also measure overlay error using scatterometry, as described in U.S. patent application Ser. No. 09/894,546, entitled "METHOD AND APPARATUS FOR CONTROLLING PHOTOLITHOGRAPHY OVERLAY REGISTRATION," filed in the name of J. Broc Stirton, assigned to the assignee of the present patent application, and incorporated herein by reference in its entirety. In the illustrated embodiment, the overlay metrology tool 230 is configured to measure overlay using multiple overlay targets. For example, the overlay metrology tool 230 measures the misregistration between a current process layer (e.g., a photoresist layer) and at least two underlying process layers, as described in greater detail below.

A controller 240 is provided for controlling the stepper 224 based on overlay metrology data collected by the overlay metrology tool 230. A data store 250 may be provided for storing overlay metrology data regarding the wafers 210 measured by the overlay metrology tool 230. For example, the overlay metrology data may be stored and indexed by wafer ID and/or lot ID, depending on the granularity available. Of course, the process line 200 may include multiple photolithography tools 220 collecting overlay data and multiple overlay metrology tools 230 with a shared or individual controllers 240.

The controller 240 adjusts the operating recipe of the stepper 224 to correct for overlay errors. In the illustrated embodiment, the controller 240 is a computer programmed with software to implement the functions described. However, as will be appreciated by those of ordinary skill in the art, a hardware controller designed to implement the particular functions may also be used. Additionally, the controller 240 may be a stand-alone controller, it may be integrated into a tool, such as the photolithography tool 220, or the overlay metrology tool 230, or it may be part of a system controlling operations in an integrated circuit manufacturing facility.

Portions of the invention and corresponding detailed description are presented in terms of software, or algorithms and symbolic representations of operations on data bits within a computer memory. These descriptions and representations are the ones by which those of ordinary skill in the art effectively convey the substance of their work to others of ordinary skill in the art. An algorithm, as the term is used here, and as it is used generally, is conceived to be a self-consistent sequence of steps leading to a desired result. The steps are those requiring physical manipulations of physical quantities. Usually, though not necessarily, these quantities take the form of optical, electrical, or magnetic signals capable of being stored, transferred, combined, compared, and otherwise manipulated. It has proven convenient at times, principally for reasons of common usage, to refer to these signals as bits, values, elements, symbols, characters, terms, numbers, or the like.

It should be borne in mind, however, that all of these and similar terms are to be associated with the appropriate physical quantities and are merely convenient labels applied to these quantities. Unless specifically stated otherwise, or as is apparent from the discussion, terms such as "processing" or "computing" or "calculating" or "determining" or "displaying" or the like, refer to the action and processes of a computer system, or similar electronic computing device, that manipulates and transforms data represented as physical, electronic quantities within the computer system's registers and memories into other data similarly represented as physical quantities within the computer system memories or registers or other such information storage, transmission or display devices.

An exemplary software system capable of being adapted to perform the functions of the controller 240, as described, is the Catalyst system offered by KLA-Tencor, Inc. The Catalyst system uses Semiconductor Equipment and Materials International (SEMI) Computer Integrated Manufacturing (CIM) Framework compliant system technologies and is based on the Advanced Process Control (APC) Framework. CIM (SEMI E81-0699—Provisional Specification for CIM Framework Domain Architecture) and APC (SEMI E93-0999—Provisional Specification for CIM Framework Advanced Process Control Component) specifications are publicly available from SEMI.

Wafers 210 are processed in the stepper 224 using a plurality of control input signals. In the illustrated embodiment, the control inputs signals used to configure the stepper 224 include an x-translation signal, a y-translation signal, an x-expansion wafer scale signal, a y-expansion expansion wafer scale signal, a reticle magnification signal, a reticle rotation signal, a wafer rotation signal, and a wafer non-orthogonality signal. Generally, errors associated with the reticle magnification signal and the reticle rotation signal relate to a particular exposure process on the surface of the wafer being processed in the exposure tool. The controller 240 is adapted to update the control input signals based on overlay error measurements performed by the overlay metrology tool 230 on a run-to-run basis.

When the stepper 224 completes processing of a wafer 210, the wafer 210 is examined by the overlay metrology tool 230. The wafer may be examined prior to developing of the photoresist layer (i.e., using the latent photoresist image) or after the developing process (i.e., using the photoresist pattern). The overlay metrology tool 230 provides a measurement of misregistration that was present in the previous exposure step. The overlay metrology tool 230 incorporates multiple overlay targets on multiple underlying process layers for measuring the misregistration. In this manner, the controller 240 may align the photoresist layer with multiple underlying process layers.

In one embodiment, the overlay metrology tool 230 measures misregistration in one direction using a first overlay target formed on one underlying process layer and misregistration in another direction using a second overlay target formed on a second underlying process layer. For example, a contact is typically used to connect an underlying source/drain region of a transistor with a line formed in a subsequent process layer. Typically, the placement of the contact with respect to the source/drain region is sensitive to misaligrnent in the X direction, while placement of the contact with respect to the line is sensitive to misalignment in the Y direction. Measuring misregistration in different directions using different targets allows the feature being formed to align with both of the underlying process layers.

In another embodiment, the overlay metrology tool 230 may measure misregistration in the same direction using multiple targets. For example, if the placement of a particular feature is sensitive to misalignment in the same direction with respect to two underlying process layers, the misregistration between both may be measured, and the controller 240 may attempt to reduce the combined misregistration by using the average of the two misregistration amounts to compute its settings.

Test structures, such a box-in-box structures, for measuring overlay errors are well known to those of ordinary skill in the art. While the invention is illustrated using box-in-box type overlay targets, its application is not limited to such targets. Other types of targets may be used.

Figure 3A:
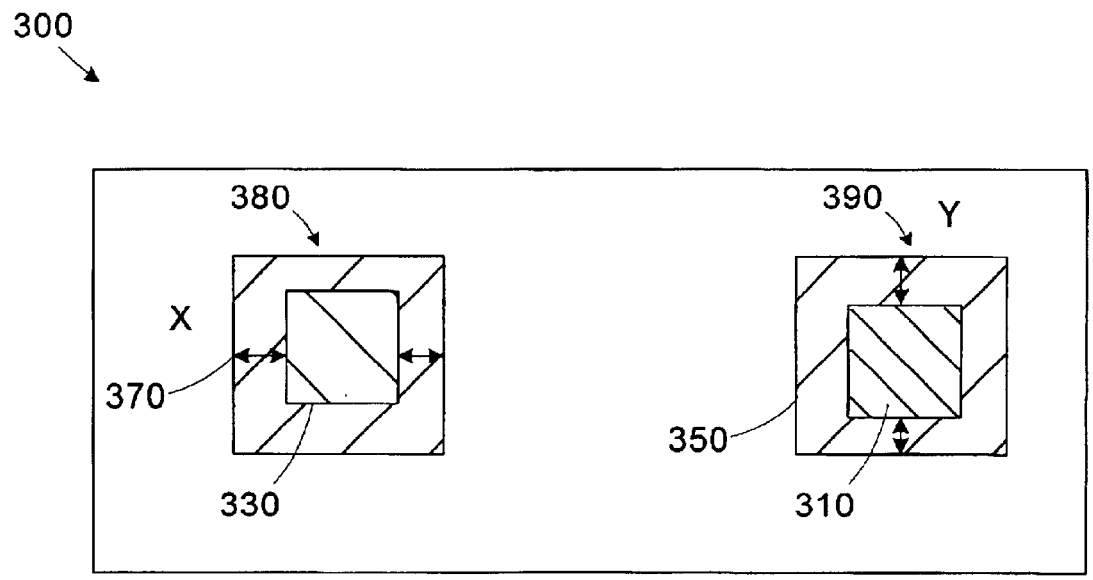
FIGS. 3A and 3B are top and cross-section views of a semiconductor device illustrating overlay targets used to measure misregistration between process layers in accordance with the present invention.
Figure 3B:
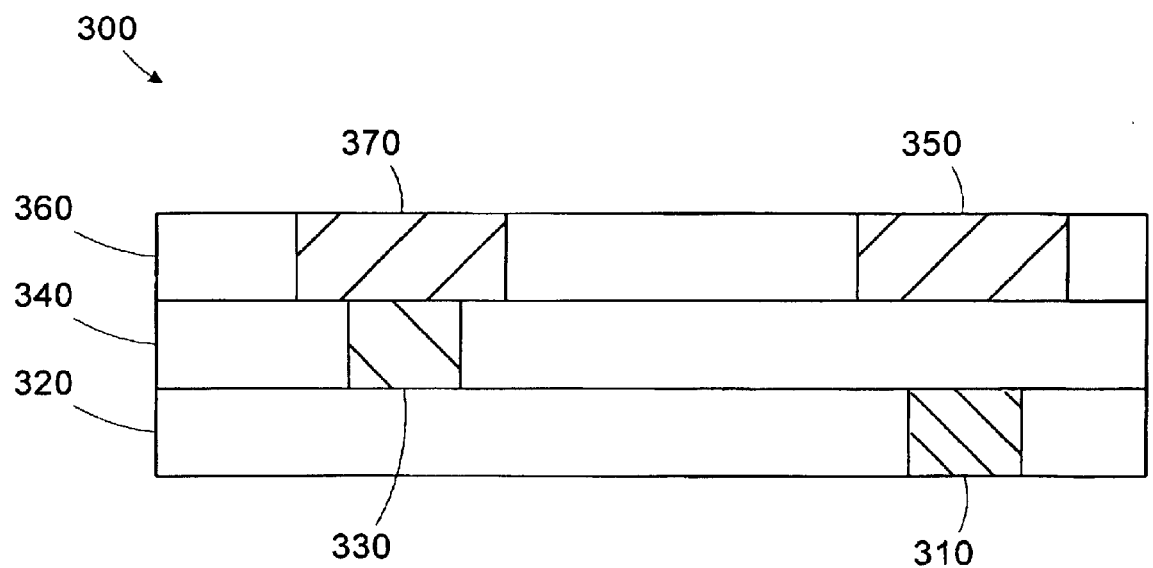

Turning now to FIGS. 3A and 3B, top and cross-section views of a semiconductor device 300 is provided. A first overlay target 310 is formed in a first process layer 320. A second overlay target 330 is formed in a second process layer 340. A third overlay target 350 is formed in a third process layer 360 overlying the first overlay target 310, and a fourth overlay target 370 is formed in the third process layer 360 overlying the second overlay target 330. Hence, the first and third overlay targets 310, 350 form a pair 380 that may be used to measure misregistration between the first and third process layers 320, 360, and the second and fourth overlay targets 330, 370 form a pair 390 that may be used to measure misregistration between the second and third process layers 340, 360. Only three process layers 320, 340, 360 are shown for clarity and ease of illustration. The semiconductor device 300 may have many more layers, including layers disposed between those illustrated.

In one embodiment, the overlay metrology tool 230 may measure misregistration in the X direction using the pair 380 and misregistration in the Y direction using the pair 390. In another embodiment, the overlay metrology tool 230 may measure misregistration in one direction (e.g., X or Y) using both pairs 380, 390. In such an embodiment, the overlay metrology tool 230 may measure misregistration in the other direction using one or both of the pairs 380, 390 or a different set of overlay targets (not shown).

The overlay metrology tool 230 stores the overlay error for the measured wafer 210 in the data store 250. The overlay error metrology data may be indexed by wafer/lot ID and layer. Returning to FIG. 2, the process employed by the controller 240 for determining control actions for the photolithography tool 220 is described in more detail. In general, the controller 240 considers overlay error data measured using both of the pairs 380, 390 of overlay targets. Depending on the particular implementation, the controller 240 may determine control actions for individual wafers or for lots of wafers. If control is performed on a lot level, the overlay error data may be associated with one or more wafers in the lot that were measured. If control is performed on a wafer level, each wafer may have an associated overlay error measurement. Of course different degrees of granularity may be used. For example, an averaging or interpolation technique may be used for wafers without specific feedforward overlay error data available.

The controller 240 may adjust the recipe of the stepper 224 for a current wafer as well as for subsequent wafers based on the overlay error data. The controller 240 may be configured with a deadband range, in which no corrections are made. The overlay errors may be compared to a predetermined set of threshold parameters. In one embodiment, the deadband contains a range of error values associated with control input signals centered proximate a set of corresponding predetermined target values. If the overlay errors acquired from the overlay metrology tool 230 are smaller than their corresponding predetermined threshold values, that particular error is deemed to be in the deadband, and the controller 240 makes no changes to the overlay control inputs. A primary purposes of the deadband is to prevent excessive control actions from causing the semiconductor manufacturing process to be inordinately jittery.

When the controller 240 determines that an overlay error condition corresponding to an overlay control input signal is not inside the deadband, the overlay errors are used to update that overlay control input signal for a photolithography process performed on the current wafer, a subsequent wafer within the lot, or a subsequent wafer or lot of wafers. The controller 240 determines a step size for changing in the value of the overlay control input signal in accordance with a control model. Equation 1 below provides an exemplary control equation for determining a change to an overlay control input signal.

New setting=Old setting−[(weight1)*(feedback overlay error value)]−[(weight2)*(feedforward overlay error value)]  (1)

As illustrated in Equation 1, the controller 240 determines the new setting of the overlay control input signal by subtracting the magnitude of the old setting of the overlay control input signal from the products of the weights and the feedback and feedforward overlay error values. The weights are predetermined gain parameters that are assigned to the error value of a particular overlay control input signal. The particular values for the weights may be determined by control simulation or experimentation. One equation may be used to update the x-translation signal based on overlay error measured using the first pair 380 and another equation may be used to update the y-translation signal based on overlay error measured using the second pair 390.

Although the weight values can be used to partially control the step size of the change in the setting of the overlay control input signal, the values of the weights may still be insufficient to prevent an excessively large step size. In other words, even if optimum weights were to be assigned to a particular error signal, a calculated step size of a change in the setting of a control input signal may be too large, such that it could cause a controller of a semiconductor manufacturing tool to perform in an excessively jittery fashion. Accordingly, the controller 240 may compare the calculated step size to a predetermined maximum step size that is allowable for the change in setting of the overlay control input signal, and thus limit the step size.

One method for using the updated overlay control input signals is implemented using control threads. Control threads can be implemented by the controller 240. Control threads are a significant part of the control scheme of a semiconductor manufacturing tool, such as the stepper 224. Each control thread acts like a separate controller, and is differentiated by various process conditions. For overlay control, the control threads are separated by a combination of different conditions, including the semiconductor manufacturing tool (e.g., stepper 224) currently processing the wafer lot, the semiconductor product, the semiconductor manufacturing operation, and the semiconductor manufacturing tool that processed the semiconductor wafer or lot at a previous layer of the wafer.

Control threads account for different semiconductor manufacturing process conditions affect the overlay error in different fashions. By isolating each of the unique semiconductor manufacturing process conditions into its own corresponding control thread, the controller 240 may more accurately evaluate the conditions in which a subsequent semiconductor wafer lot in the control thread will be processed. Since the error measurement is more relevant, changes to the overlay control input signals based upon the error will be more appropriate. The implementation of the control scheme described by the present invention can lead to a reduction in the overlay error. After processing of a wafer, the overlay metrology tool 230 provides a feedback measure of the control error. The overlay error measurement may correspond to one or more of the overlay control input signals.

The controller 240 may perform various preprocessing or data manipulation activities when determining a control action. One such preprocessing activity is outlier rejection. Outlier rejection is a gross error check that is employed to ensure that the measured overlay errors are reasonable in light of the historical performance of the semiconductor manufacturing process. This procedure involves comparing each of the feedback and feedforward overlay errors to corresponding predetermined boundary parameters. In one embodiment, even if one of the predetermined boundaries is exceeded, the error data from the entire semiconductor wafer or lot may be rejected. To determine the limits of the outlier rejection boundary, thousands of actual semiconductor manufacturing fabrication data points are collected. The standard deviation for each error parameter in this collection of data is then calculated. The boundary threshold is selected as a multiple of the standard deviation (i.e., positive or negative). The selection of the outlier rejection boundary helps ensure that only the points that are significantly outside the normal operating conditions of the process are rejected.

A second preprocessing function the controller 240 may perform is to smooth out or filter the data. Overlay error measurements are subject to a certain amount of randomness. Filtering the feedback overlay error data results in a more accurate assessment of the error in the overlay control input signal settings. In one embodiment, the controller 240 uses an Exponentially-Weighted Moving Average (EWMA) filter to smooth the data, although other filtering procedures may be used. The equation for an EWMA filter is illustrated in Equation 2.

$$\text{New avg.}=(\text{weight})*(\text{current measurement})+(1-\text{weight})*(\text{previous EWMA avg})]. \quad (2)$$

The weight is an adjustable parameter that can be used to control the amount of filtering and generally has a value between zero and one. The weight represents the confidence in the accuracy of the current data point. If the measurement is considered to be accurate, the weight should be close to one. If there were a significant amount of fluctuations in the process for previous processing runs, then a number closer to zero would be appropriate. The new average is calculated from the current measurement, the weight, and the last average calculated. The EWMA filtering process may use the previous average, the weight, and the current measurement as described above, or alternatively, only some of the data (i.e., the most recent) may be used to calculate the average.

The manufacturing environment in the semiconductor manufacturing facility presents some unique challenges. The order that the semiconductor wafer lots are processed through tools; such as the stepper 224, may not correspond to the order in which the overlay metrology tool 230 measures the overlay error. Such a situation could lead to data points being added to the EWMA average out of sequence. Also, wafers may be analyzed more than once to verify the error measurements. Without data retention, both readings would contribute to the EWMA average, which may be an undesirable characteristic. Furthermore, some of the control threads may have low volume, which may cause the previous average to be outdated such that it may not be able to accurately represent the error in the overlay control input signal settings. For these reasons, the controller 240 may access stored data to calculate the EWMA filtered error. Semiconductor wafer lot data, including the lot number, the time the lot was processed on the stepper 224, and the multiple error estimates, are stored in the data store 250 under the control thread name. When a new set of overlay error data is collected, the stack of data is retrieved from data store and analyzed. The lot number of the current semiconductor wafer lot being processed is compared to those in the stack. If the lot number matches any of the data present there, the error measurements are replaced. Otherwise, the data point is added to the current stack in chronological order, according to the time periods when the lots were processed through the stepper 224. In some embodiments, data points may expire after a predetermined time period (e.g., 48 hours).

As described above, the controller 240 may be implemented using an APC framework. Deployment of the control strategy taught by the present invention using the APC framework could require a number of software components. In addition to components within the APC framework, a computer script may be written for each of the semiconductor manufacturing tools involved in the control system, such as the stepper 224. When a semiconductor manufacturing tool in the control system is started, it generally initiates control script to complete the actions implemented by the controller 240. The control methods described above are generally defined and performed in these control scripts.

The controller 240 may implement a control technique for a variety of control parameters for the stepper 224, including an x-translation parameter, a y-translation parameter, an x-expansion wafer scale parameter, a y-expansion wafer scale parameter, a reticle magnification parameter, a reticle rotation parameter, a wafer rotation parameter, and a wafer non-orthogonality parameter. The overlay control model may be developed empirically using commonly known linear or non-linear techniques. The control model may be a relatively simple equation based model, as described above (e.g., linear, exponential, weighted average, etc.), or a more complex model, such as a neural network model, principal component analysis (PCA) model, or a projection to latent structures (PLS) model. The specific implementation of the model may vary depending on the modeling technique selected.

Overlay models may be generated by the controller 240, or alternatively, they may be generated by a different processing resource (not shown) and stored on the controller 240 after being developed. The overlay model may be developed using the stepper 224 or using a different tool (not shown) having similar operating characteristics. For purposes of illustration, it is assumed that the overlay model is generated and updated by the controller 240 or other processing resource based on the actual performance of the stepper 224 as measured by the overlay metrology tool 230. The overlay model may be trained based on historical data collected from numerous processing runs of the stepper 224.

Figure 4:
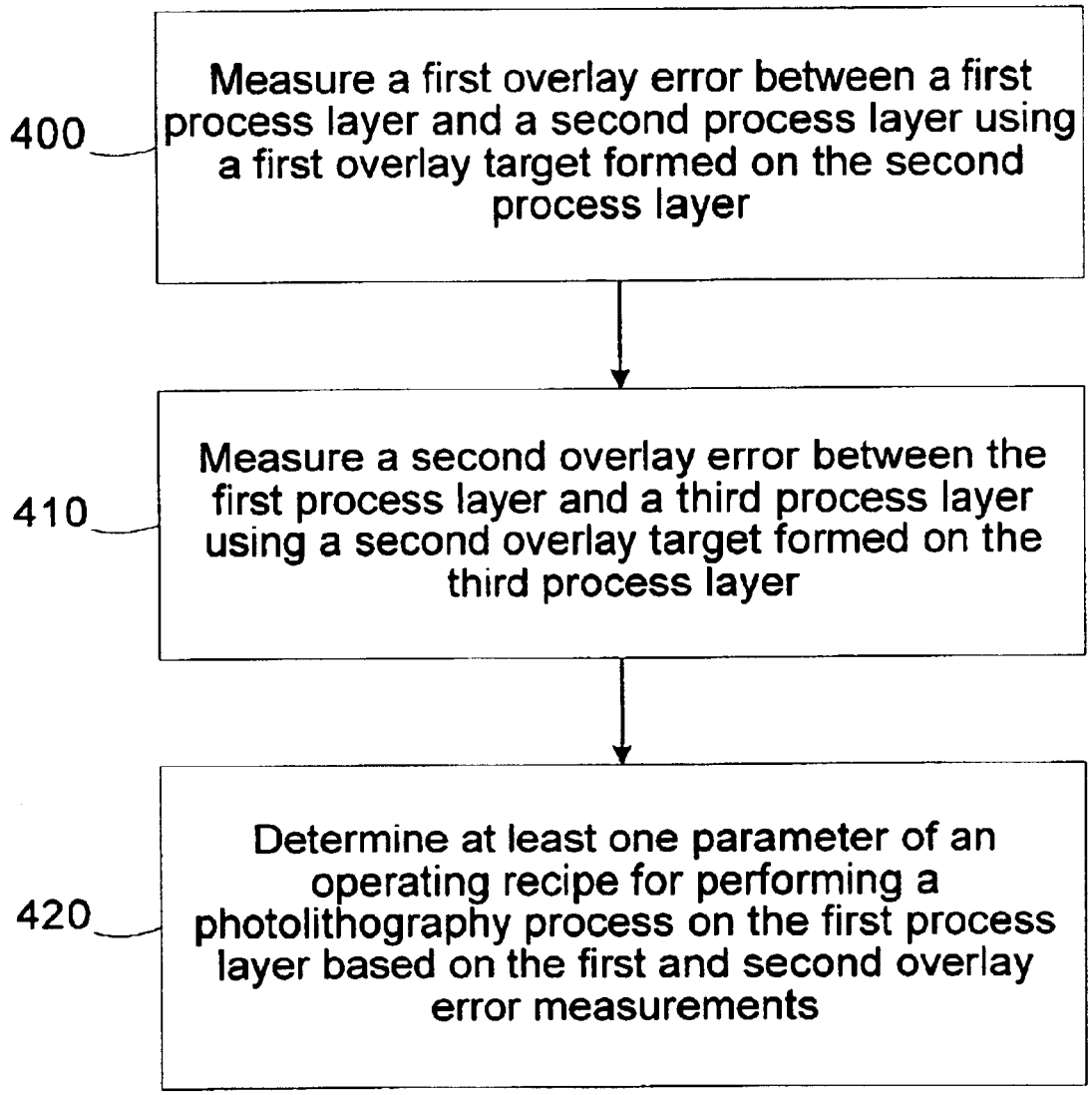
FIG. 4 is a simplified flow diagram of a method for controlling photolithography overlay registration using multiple overlay targets in accordance with another illustrative embodiment of the present invention While the invention is susceptible to various modifications and alternative forms, specific embodiments thereof have been shown by way of example in the drawings and are herein described in detail. It should be understood, however, that the description herein of specific embodiments is not intended to limit the invention to the particular forms disclosed, but on the contrary, the intention is to cover all modifications, equivalents, and alternatives falling within the spirit and scope of the invention as defined by the appended claims.

FIG. 4 is a simplified flow diagram of a method for controlling a photolithography process in accordance with another illustrative embodiment of the present invention. In block 400, a first overlay error between a first process layer and a second process layer is measured using a first overlay target formed on the second process layer. In block 410, a second overlay error between the first process layer and a third process layer is measured using a second overlay target formed on the third process layer. In block 420, at least one parameter of an operating recipe for performing a photolithography process on the first process layer is determined based on the first and second overlay error measurements.

Controlling overlay error based on measurements from multiple overlay targets formed on multiple process layers has numerous advantages. The alignment between a current layer and multiple underlying layers may be controlled simultaneously to decrease variation with respect to both layers. Decreased variation reduces the likelihood that a device may be degraded or must be scrapped. Accordingly, the quality of the devices produced on the processing line 200 and the efficiency of the processing line 200 are both increased.

The particular embodiments disclosed above are illustrative only, as the invention may be modified and practiced in different but equivalent manners apparent to those skilled in the art having the benefit of the teachings herein. Furthermore, no limitations are intended to the details of construction or design herein shown, other than as described in the claims below. It is therefore evident that the particular embodiments disclosed above may be altered or modified and all such variations are considered within the scope and spirit of the invention. Accordingly, the protection sought herein is as set forth in the claims below.

What is claimed:

1. A method, comprising:
measuring a first overlay error between a first process layer and a second process layer using a first overlay target formed on the second process layer;
measuring a second overlay error between the first process layer and a third process layer using a second overlay target formed on the third process layer; and
determining at least one parameter of an operating recipe for performing a photolithography process on the first process layer based on the first and second overlay error measurements.

2. The method of claim 1, wherein measuring the first overlay error comprises measuring the first overlay error in a first direction and measuring the second overlay error comprises measuring the second overlay error in a second direction.

3. The method of claim 1, wherein measuring the first overlay error comprises measuring the first overlay error in a first direction and measuring the second overlay error comprises measuring the second overlay error in the first direction.

4. The method of claim 3, further comprising averaging the first and second overlay errors.

5. The method of claim 1, wherein determining the at least one parameter in the operating recipe further comprises determining at least one of an x-translation parameter, a y-translation parameter, an x-expansion wafer scale parameter, a y-expansion wafer scale parameter, a reticle magnification parameter, a reticle rotation parameter, a wafer rotation parameter, and a wafer non-orthogonality parameter.

6. The method of claim 1, further comprising forming a third overlay target in the first process layer overlying the first overlay target and a fourth overlay target in the first process layer overlying the second overlay target.

7. The method of claim 6, wherein forming the third and fourth overlay target further comprises forming the third and fourth overlay target in an exposed photoresist layer.

8. The method of claim 6, wherein forming the third and fourth overlay target further comprises forming the third and fourth overlay target in a developed photoresist layer.

9. A method, comprising:
measuring a first overlay error between a first process layer and a second process layer using a first overlay target formed on the second process layer;
measuring a second overlay error between the first process layer and a third process layer using a second overlay target formed on the third process layer;
aligning the first process layer in a first direction based on the first overlay error measurement; and
aligning the first process layer in a second direction based on the second overlay error measurement.

10. The method of claim 9, further comprising forming a third overlay target in the first process layer overlying the first overlay target and a fourth overlay target in the first process layer overlying the second overlay target.

11. The method of claim 10, wherein forming the third and fourth overlay target further comprises forming the third and fourth overlay target in an exposed photoresist layer.

12. The method of claim 10, wherein forming the third and fourth overlay target further comprises forming the third and fourth overlay target in a developed photoresist layer.

13. A system, comprising:
a metrology tool configured to measure a first overlay error between a first process layer and a second process layer using a first overlay target formed on the second process layer and measure a second overlay error between the first process layer and a third process layer using a second overlay target formed on the third process layer; and
a controller configured to determine at least one parameter of an operating recipe for performing a photolithography process on the first process layer based on the first and second overlay error measurements.

14. The system of claim 13, wherein the metrology tool is configured to measure the first overlay error in a first direction and measure the second overlay error in a second direction.

15. The system of claim 13, wherein the metrology tool is configured to measure the first overlay error in a first direction and measure the second overlay error in the first direction.

16. The system of claim 15, wherein the controller is configured to average the first and second overlay errors.

17. The system of claim 13, wherein the controller is configured to determine at least one of an x-translation parameter, a y-translation parameter, an x-expansion wafer scale parameter, a y-expansion wafer scale parameter, a reticle magnification parameter, a reticle rotation parameter, a wafer rotation parameter, and a wafer non-orthogonality parameter.

18. The system of claim 13, wherein the first process layer includes a third overlay target overlying the first overlay target and a fourth overlay target overlying the second overlay target.

19. The system of claim 18, wherein the first process layer further comprises an exposed photoresist layer.

20. The system of claim 18, wherein forming the third and fourth overlay target further comprises forming the third and fourth overlay target in a developed photoresist layer.

21. A system, comprising:
a metrology tool configured to measure a first overlay error between a first process layer and a second process layer using a first overlay target formed on the second process layer and measure a second overlay error between the first process layer and a third process layer using a second overlay target formed on the third process layer; and
a controller adapted to align the first process layer in a first direction based on the first overlay error measurement and align the first process layer in a second direction based on the second overlay error measurement.

22. The system of claim 21, wherein the first process layer includes a third overlay target overlying the first overlay target and a fourth overlay target overlying the second overlay target.

23. The system of claim 22, wherein the first process layer further comprises an exposed photoresist layer.

24. The system of claim 22, wherein the first process layer further comprises a developed photoresist layer.

* * * * *